United States Patent
Robertson et al.

(10) Patent No.: US 9,118,179 B2
(45) Date of Patent: Aug. 25, 2015

(54) INTEGRATED CIRCUIT DEVICE AND METHOD FOR DETECTING AN EXCESSIVE VOLTAGE STATE

(75) Inventors: Alistair Robertson, Glasgow (GB); Carl Culshaw, Wigan (GB); Alan Devine, Paisley (GB)

(73) Assignee: Freescale Semiconductor, Inc., Austin, TX (US)

( * ) Notice: Subject to any disclaimer, the term of this patent is extended or adjusted under 35 U.S.C. 154(b) by 198 days.

(21) Appl. No.: 13/880,193

(22) PCT Filed: Nov. 22, 2010

(86) PCT No.: PCT/IB2010/055318
§ 371 (c)(1),
(2), (4) Date: Apr. 18, 2013

(87) PCT Pub. No.: WO2012/069871
PCT Pub. Date: May 31, 2012

(65) Prior Publication Data
US 2013/0229737 A1    Sep. 5, 2013

(51) Int. Cl.
*H02H 3/20* (2006.01)
*G01R 19/00* (2006.01)
*H03M 1/12* (2006.01)
*G01R 19/165* (2006.01)

(52) U.S. Cl.
CPC .............. *H02H 3/20* (2013.01); *G01R 19/0084* (2013.01); *H03M 1/12* (2013.01); *H03M 1/129* (2013.01); *G01R 19/165* (2013.01)

(58) Field of Classification Search
CPC ........ H02H 3/20; H03M 1/12; G01R 19/0084
USPC ............................................................ 361/56
See application file for complete search history.

(56) References Cited

U.S. PATENT DOCUMENTS

| 5,661,422 | A |   | 8/1997  | Tice et al. |
| 5,781,391 | A |   | 7/1998  | Ide et al.  |
| 5,969,957 | A | * | 10/1999 | Divan et al. ..................... 363/36 |

(Continued)

FOREIGN PATENT DOCUMENTS

| EP | 1130785 A2 | 9/2001 |
| EP | 1903765 A2 | 3/2008 |

(Continued)

OTHER PUBLICATIONS

International Search Report and Written Opinion correlating to PCT/IB2010/055318 dated Jul. 28, 2011.

(Continued)

*Primary Examiner* — Thienvu Tran
*Assistant Examiner* — Kevin J Comber

(57) ABSTRACT

An integrated circuit device comprising at least one analog to digital converter. The at least one ADC comprises at least one input operably coupled to at least one external contact of the integrated circuit device. The integrated circuit device further comprises detection circuitry comprising at least one detection module. The at least one detection module being arranged to receive at a first input thereof an indication of a voltage level at the at least one input of the at least one ADC, compare the received indication to a threshold value, and if the received indication exceeds the threshold value, output an indication that an excessive voltage state at the at least one input of the at least one ADC has been detected.

20 Claims, 2 Drawing Sheets

(56) References Cited

U.S. PATENT DOCUMENTS

| | | |
|---|---|---|
| 6,300,889 B1 | 10/2001 | Piasecki |
| 6,583,748 B1 * | 6/2003 | Iwaguro et al. ............... 341/160 |
| 6,664,841 B1 | 12/2003 | Cetin et al. |
| 7,372,683 B2 | 5/2008 | Yamamura et al. |
| 7,864,495 B2 | 1/2011 | Ueda |
| 8,315,026 B2 | 11/2012 | Roth et al. |
| 2003/0030955 A1 | 2/2003 | Yamamura et al. |
| 2003/0034853 A1 * | 2/2003 | Chou ............................ 332/109 |
| 2005/0127883 A1 * | 6/2005 | Hoshino et al. ............... 323/274 |
| 2006/0109157 A1 | 5/2006 | Lee |
| 2007/0075748 A1 * | 4/2007 | Bhattacharya et al. ......... 327/74 |
| 2008/0074817 A1 | 3/2008 | Crain et al. |
| 2009/0315481 A1 * | 12/2009 | Zhao ............................ 315/297 |
| 2012/0134060 A1 | 5/2012 | Bode et al. |

FOREIGN PATENT DOCUMENTS

| | | |
|---|---|---|
| JP | 2008072406 A | 3/2008 |
| WO | 2007142015 A1 | 12/2007 |

OTHER PUBLICATIONS

Kertis, R. et al., "A 20 GS/s 5-Bit SiGe BiCMOS Dual-Nyquist Flash ADC With Sampling Capability up to 35 GS/s Featuring Offset Corrected Exclusive-Or Comparators", IEEE Journal of Solid-State Circuits, vol. 44, Issue: 9, Sep. 2009, pp. 2295-2311.

Analog Devices, Inc., "1.5 A LED Flash Driver with I2C-Compatible Interface—ADP1650", Retrieved from the Internet: http://www.analog.com/static/imported-files/data_sheets/adp1650.pdf, Jan. 1, 2010, pp. 1-32, figures 32, 37, 40, 41.

\* cited by examiner

INTEGRATED CIRCUIT DEVICE AND METHOD FOR DETECTING AN EXCESSIVE VOLTAGE STATE

FIELD OF THE INVENTION

The field of this invention relates to an integrated circuit device and a method for detecting an excessive voltage state, and in particular to an integrated circuit device and a method for detecting an excessive voltage/input injection current state for at least one input of at least one analogue to digital converter (ADC), where this input state could be permanent or intermittent.

BACKGROUND OF THE INVENTION

In the field of analogue to digital converters (ADCs), the accuracy of an ADC channel may be significantly impacted by an excessive pad voltage and, thus, an injection current. Such an excessive pad voltage may be caused by a short circuit or an Electrostatic Discharge (ESD) event, even if such an event occurs on an adjacent or nearby channel. Typically, excessive pad voltages and injection currents are limited by protection circuitry, such as ESD clamping diodes, external series resistors, etc. However, whilst such protection circuitry may be sufficient to provide a level of protection against damage caused by excessive pad voltages and injection currents, such protection circuitry is not capable of completely masking the effects of such events. Accordingly, when a fault condition, such as a short circuit to a supply voltage occurs, or an ESD event occurs, resulting in a larger than expected current being injected into an ADC pin, such an event will have a significant influence on the input signal of the ADC. In some instances, this affects the accuracy of the signal output by the ADC, despite the provision of protection circuitry. Furthermore, pads in close proximity to such an event, and particularly adjacent pads, may be affected by excessive voltage/injection current due to potential secondary effects of localised supply rail droop/surge.

ESD events, etc. tend to be of a short duration, and as such their effects typically dissipate relatively quickly, enabling normal operation of, in this scenario, the ADC to resume. However, corrupt output values from the ADC, as caused by an ESD event, etc., will have been provided to other circuitry such as, say, signal processing logic or the like, which rely on the values output by the ADC to perform their respective functions. Thus, the corrupt values provided by the ADC as a result of an ESD event or the like may cause inappropriate functioning of the system that relies on the values output by the ADC.

SUMMARY OF THE INVENTION

The present invention provides an integrated circuit device and a method for detecting an excessive voltage state for at least one input of at least one analogue to digital converter (ADC) as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

The present invention will now be described with reference to the drawings, and in particular with reference to example embodiments of an integrated circuit device comprising a single input of a single analogue to digital converter (ADC). However, in other examples the present invention may equally be applied to integrated circuit devices and the like comprising a plurality of ADCs, and to integrated circuit devices comprising one or more ADCs comprising more than one input.

Figure 1:
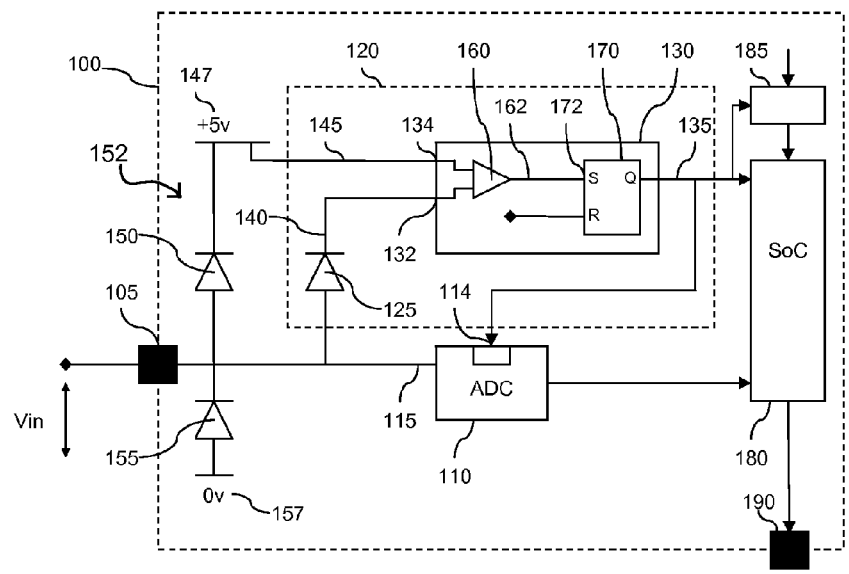
FIGS. 1 and 2 illustrate an example of an integrated circuit device.

Referring first to FIG. 1, there is illustrated an example of an integrated circuit device 100 adapted in accordance with some example embodiments of the present invention. The integrated circuit device 100 comprises at least one analogue to digital converter (ADC) 110, the at least one ADC 110 comprising at least one input 115 (with a single input shown for clarity purposes only) operably coupled to at least one external contact 105 of the integrated circuit device 100, such as an input/output pad/pin.

The accuracy of an ADC channel can be significantly impacted by an excessive pad voltage/injection current, such as may be caused by a short circuit or an Electrostatic Discharge (ESD) event, even if such an event occurs on an adjacent or nearby channel. Accordingly, when a fault condition such as a short circuit to a supply voltage occurs, or an ESD event occurs, resulting in an excessive voltage at, and/or a larger than expected current being injected into, an ADC input pin, such an event will have a significant influence on the input signal of the ADC, thereby affecting the accuracy of the signal output by the ADC.

Accordingly, the integrated circuit device 100 of FIG. 1 further comprises detection circuitry 120 comprising at least one detection module 130. The detection module 130 is arranged to receive at a first input 132 thereof an indication 140 of a voltage level at the input 115 of the ADC 110. The detection module 130 is further arranged to compare the received indication 140 to a rail supply voltage or threshold value 145, and if the received indication 140 exceeds the threshold value, to output 135 an indication that an excessive voltage state at the input 115 of the ADC 110 has been detected.

Thus, in the event of, say, a short circuit between the external contact 105 of the integrated circuit device 100 and a device battery, or following an excessive current injection such as resulting from an ESD event, a higher than normal voltage (leading to an injection current event) will be experienced at the external contact 105, and thereby at the input 115 of the ADC 110. The detection circuitry 120 is able to detect such an excessive voltage, and output 135 an indication that such an excessive voltage state has been detected. Accordingly, such an indication may be provided to, say, signal processing logic, control circuitry, etc., in order for appropriate action to be taken to avoid potentially corrupt output values from the ADC 110 caused by the excessive voltage state propagating.

For the illustrated example, a second input 134 of the detection circuitry 120 is operably coupled to a supply rail 147 of the integrated circuit device 100. As such, the detection circuitry 120 is further arranged to receive at the second input 134 thereof a rail supply voltage 145 for the integrated circuit device 100 for use as the threshold value with which to compare the indication 140 of a voltage level at the input 115 of the ADC 110. Accordingly, the detection circuitry 120 of FIG. 1 is arranged to compare the received indication 140 of a voltage level at the input 115 of the ADC 110 to the rail supply voltage 145. If the received indication 140 exceeds the rail supply voltage 145, the detection circuitry 120 may output 135 an indication that an excessive voltage state at the at least one input 115 of the at least one ADC 110 has been detected. In this manner, an excessive voltage state for the input of the ADC 110 may be detected when the voltage at the input of the ADC 110 exceeds a voltage level approximately comparable to the supply rail voltage 145 of the integrated circuit device 100, and thereby outside of an expected operating voltage range.

The detection circuitry 120 may further comprise a voltage offset component, operably coupled between the input 115 of the ADC 110 and the first input 132 of the detection module 130, in order to offset the voltage level at the first input 132 thereof with respect to the voltage level at the input 115 of the ADC 110. Such a voltage offset component may allow the voltage level at the input 115 to exceed (by an amount substantially equal to the voltage drop across the voltage offset component) the threshold value, which for the illustrated example comprises the supply rail voltage 145, before an excessive voltage state is detected. In other examples, alternative detection modules and/or circuits and/or components may be used.

For example, and as illustrated in FIG. 1, the integrated circuit device 100 may further comprise ESD protection circuitry 152 operably coupled between the input 115 of the ADC 110 and the supply rail 147. Accordingly, the voltage offset component 125 may be arranged to provide a voltage offset between the input 115 of the ADC 110 and the first input 132 of the detection module 130, representative of a voltage drop across the ESD protection circuitry 152 during an excessive voltage state at the input 115 of the ADC 110. Specifically for the illustrated example, the ESD protection circuitry 152 comprises an ESD protection diode 150 operably coupled between the input 115 of the ADC 110 and the supply rail 147 and forward biased towards the supply rail 147. In other examples, alternative ESD protection circuits and/or components may be used. Accordingly, for the illustrated example the voltage offset component comprises a diode 125 operably coupled between the input 115 of the ADC 110 and the first input 132 of the detection module 130, and forward biased towards the first input 132 of the detection module. For completeness, the integrated circuit device 100 illustrated in FIG. 1 comprises a further ESD protection diode 155 operably coupled between the input 115 of the ADC 110 and a ground plane 157.

In this manner, when a voltage level at the input 115 of the ADC 110 exceeds the supply rail voltage 145, the ESD protection diode 150 becomes forward biased, thereby allowing current to flow there through to the supply rail 147. In order for the ESD protection diode 150 to become forward biased, the voltage at the input 115 of the ADC 110 must be sufficient to overcome the built-in forward potential of the ESD protection diode 150, and as such must exceed the sum of the supply rail voltage 145 and the forward potential of the ESD protection diode 150. By providing a comparable offset diode 125 between the input 115 of the ADC 110 and the first input 132 of the detection module 130, the voltage level at the first input 132 of the detection module 130 will be approximately equal to the voltage level at the input 115 of the ADC 110 minus the forward potential of the offset diode 125. As such, during an excessive voltage state at the input 115 of the ADC 110, for example whereby the voltage level at the input 115 of the ADC 110 exceeds the sum of the supply rail voltage 145 and the forward potential of the ESD protection diode 150, the forward potential of the offset diode 125 substantially counteracts the forward potential of the ESD protection diode 150. This results in a voltage level at the first input 132 of the detection module 130 at least equal to the supply rail voltage 145. Accordingly, by comparing the voltage level at the first input 132 of the detection module 130 to the supply rail voltage 145, an excessive voltage state at the input 115 of the ADC 110 may be detected.

Figure 2:
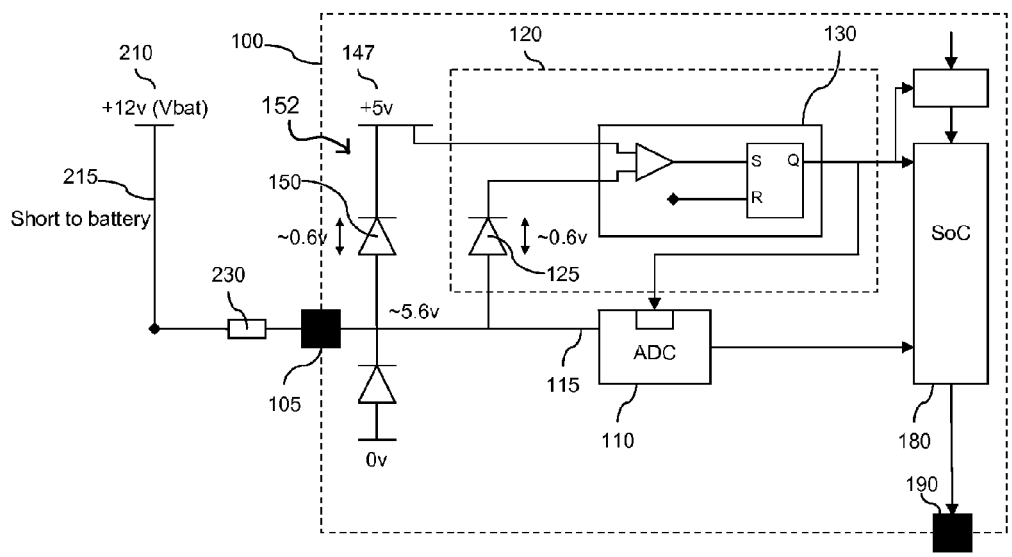

FIG. 2 illustrates an example of the integrated circuit device 100 of FIG. 1 where an excessive voltage state exists at the external contact 105. For the illustrated example of FIG. 2, a short circuit has occurred between the external contact 105 and a device battery 210, as illustrated generally at 215. Other causes of an excessive voltage state at the external contact 105 may include an ESD event resulting in a high current injection.

For the illustrated example, the device battery 210 provides a 12v supply, significantly higher than the 5v supply rail 147 of the integrated circuit device 100. An external series resistance 230 has been operably coupled to the external contact 105 of the integrated circuit device 100 in order to limit current flowing into the integrated circuit device 100 via the external contact 105, thereby ensuring current injection of the ADC channel remains within injection current specifications, for normal input voltage range conditions, for example <~5.6V in the illustrated example. However, when an excessive voltage state exists at the external contact 105, such as when a short circuit occurs between the external contact 105 and device battery 210 as illustrated in FIG. 2, or in the occurrence of an ESD event, a larger than expected current may be injected into the ADC's external contact 105. Such a large current being injected into the external contact 105 of the integrated circuit device 100 results in an increased voltage level at the external contact 105, and thereby at the input 115 of the ADC 110.

When a voltage level at the input 115 of the ADC 110 exceeds the supply rail voltage 145, the ESD protection diode 150 becomes forward biased, thereby allowing current to flow there through to the supply rail 147. In order for the ESD protection diode 150 to become forward biased, the voltage at the input 115 of the ADC 110 must be sufficient to overcome the built-in forward potential of the ESD protection diode 150, and as such must exceed the sum of the supply rail voltage 145 (5v) and the forward potential of the ESD protection diode 150 (0.6v). Once the voltage level at the input 115 of the ADC 110 is sufficient to overcome the forward potential of the ESD protection diode 150 (e.g. 5.6v), current starts flowing through the ESD protection diode 150 to the supply rail 147, thereby limiting the voltage level at the input 115 of the ADC 110 to, for the illustrated example just above the required 5.6v to overcome the forward potential of the ESD protection diode 150.

Conversely, the voltage level at the first input 132 of the detection module 130 will be approximately equal to the voltage level at the input 115 of the ADC 110 minus the forward potential of the offset diode 125 (0.6v). As such, during an excessive voltage state at the input 115 of the ADC 110, for example whereby the voltage level at the input 115 of the ADC 110 exceeds the sum of the supply rail voltage 145 and the forward potential of the ESD protection diode 150 (e.g. >5.6v), the forward potential of the offset diode 125 substantially counteracts the forward potential of the ESD protection diode 150, thereby resulting in a voltage level at the first input 132 of the detection module 130 being at least equal to the supply rail voltage 145 (5v). Accordingly, by comparing the voltage level at the first input 132 of the detection module 130 to the supply rail voltage 145, an excessive voltage state at the input 115 of the ADC 110 may be detected.

Referring back to FIG. 1, for the illustrated example, the detection module 130 further comprises a comparator 160 arranged to receive at a first input thereof the indication 140 of a voltage level at the input 115 of the ADC 110 (which for the illustrated example comprises a diode drop (e.g. 0.6v) less than the voltage level at the input 115 of the ADC 110). The comparator 160 is further arranged to receive at a second input 134 thereof a threshold value, which for the illustrated example comprises the supply rail voltage 145. The comparator 160 compares the received indication 140 of the voltage level at the input 115 of the ADC 110 to the threshold value 145, and outputs 162 a result of the comparison.

In one example, the detection module 130 further comprises a latch component 170, which for the illustrated example comprises a flip-flop. The latch component 170 is arranged to receive at a first input 172 thereof the result of the comparison 162 output by the comparator 160. If the result of the comparison 162 indicates that the voltage level at the input 115 of the ADC 110 exceeds the threshold value 145, the latch component 170 sets an output 135 thereof to indicate that an excessive voltage state at the at least one input 115 of the at least one ADC 110 has been detected. In this manner, even if the excessive voltage state at the input 115 of the ADC 110 should cease to exist, the latch component 170 will maintain at its output an indication that an excessive voltage state was detected. The latch component 170 may subsequently be reset once appropriate action has been taken.

For the illustrated example, the output 135 of the detection circuitry 120 may be operably coupled to one or more signal processors of the integrated circuit device 100, such as the System-on-Chip (SoC) 180 illustrated in FIG. 1. In this manner, upon receipt of an indication from the detection circuitry 120 that an excessive voltage state has been detected at the input 115 of the ADC 110, the SoC 180 is able to take appropriate action, for example to avoid propagation of potentially corrupt output values from the ADC 110 caused by the excessive voltage state. The output 135 of the detection circuitry may additionally/alternatively be operably coupled to one or more timebase latches within the ADC 110, for example as illustrated at 114 in FIG. 1. In this manner, specific ADC conversions that may have been affected by the excessive voltage state may be identified. Furthermore, the output 135 of the detection circuitry may additionally/alternatively be operably coupled to one or more interrupt modules or components or circuits arranged to interrupt triggering and/or status bit modifications within the integrated circuit device 100, such as illustrated generally at 185 in FIG. 1. In this manner, triggering and/or status bit modifications occurring based at least partly on, or otherwise influenced by, the output 135 of the detection circuitry 120 may be interrupted to avoid corrupt signals from being propagated.

By detecting an excessive voltage state at the input 115 of the ADC 110 as described above, the injection of large currents into the ADC channel or the like, such as resulting from ESD events or short circuits may be detected. By detecting such current injections, appropriate actions may be taken, for example to avoid corrupt values provided by the ADC 110 causing inappropriate functioning of the system that relies on the values output by the ADC 110. It is further contemplated that the detection of an excessive voltage state at the input 115 of the ADC 110 may also be used to indicate possible damage to the IC as a result of high current injections, as well as identifying sources of additional current consumption within the integrated circuit device.

In accordance with some example embodiments of the present invention, when one or more excessive voltage states is/are detected, functionality within, say, the SoC 180 may provide an external notification, via one or more external pins 190 of the integrated circuit device 100, indicating that the device 100 is in an undesirable and/or unpredictable condition. This may be further extended by then forcing the integrated circuit device 100 into a 'safe' state with these external pins for which excessive voltage states have been detected being disconnected by internal circuitry (not shown).

Furthermore, the detection circuitry 120 may be so arranged as to also comprise (or at least be provided with) an internally generated, and inherently more reliable, reference source (not shown). In this manner, upon an excessive voltage state being detected on an external contact 105, the detection circuitry 120 may switch the input 115 of the ADC 110 from the 'unknown' external input to the reliable internal reference.

In some examples of the invention, depending on an analysis of the detection of excessive voltage states, the SoC 180 may determine whether the excessive input voltage is potentially damaging, and hence whether to disconnect this external input path. The SoC 180 may then flag the input path malfunction to remaining parts of the integrated circuit device 100, and provide some external indication via one or more external pins. This additional level of safety allows the overall system to take effective action in order to guarantee the long term behaviour of the application.

Such benefits are especially advantageous within systems where fault tolerance and reliability are of particular interest, for example within automotive environments and the like.

Figure 3:
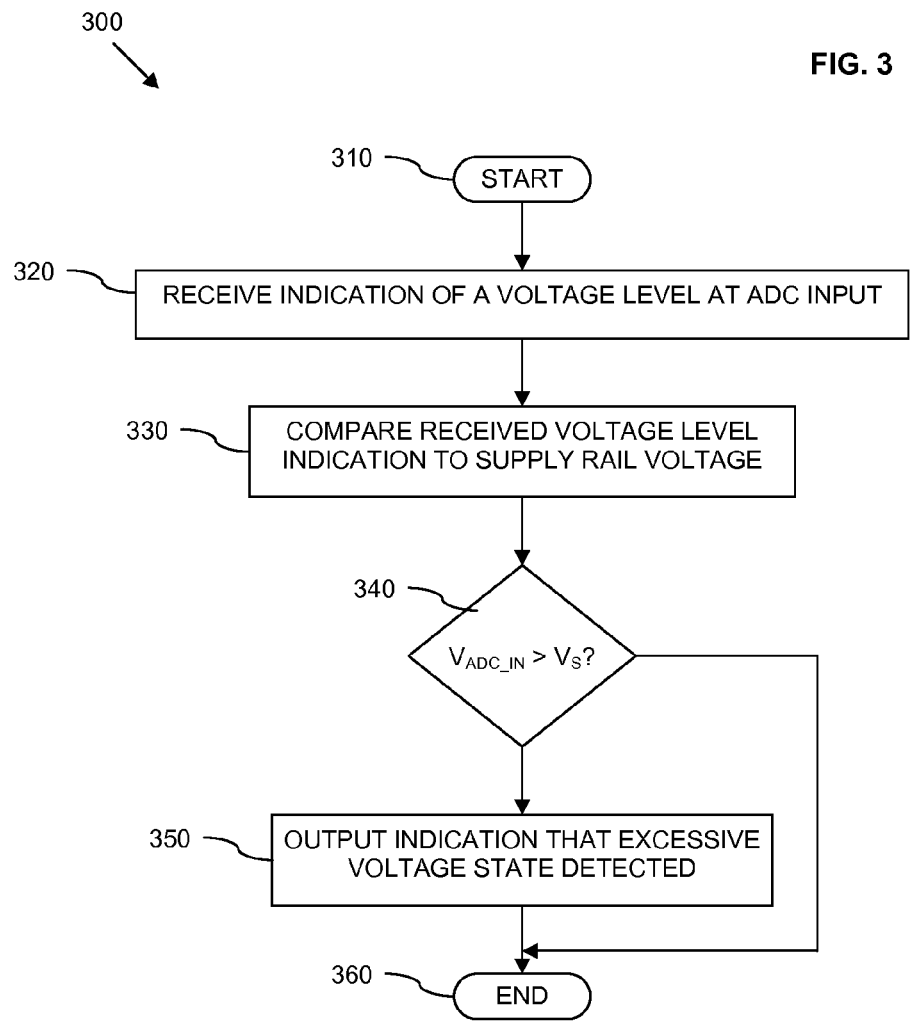
FIG. 3 illustrates an example of a simplified flowchart of a method for detecting an excessive voltage state for at least one input of at least one ADC.

Referring now to FIG. 3, there is illustrated an example of a simplified flowchart 300 of a method for detecting an excessive voltage state for at least one input of at least one ADC in accordance with some embodiments of the present invention, for example as may be implemented within the integrated circuit device of FIGS. 1 and 2. The method starts at step 310, and moves on to step 320 with a receipt of an indication of a voltage level for at least one input of the at least one ADC. The received indication is then compared to a threshold value at step 330, for example to a rail supply voltage as illustrated in FIGS. 1 and 2. Next, at step 340, if the received indication exceeds the threshold value, the method moves on to step 350, where an indication that an excessive voltage state at the at least one input of the at least one ADC has been detected is output. The method then ends at step 360. However, if at step 340 the received indication does not exceed the threshold value, the method simply ends at step 360.

In accordance with some example embodiments of the present invention, before using results output by the ADC 110 in any calculation, application software (for example executed by the SoC 180), may be executed to check status bits to see if the ADC result is valid, for example if an excessive voltage state (leading to an injection current event) has been detected in an ADC channel, or any nearby channels therefor. If such an excessive voltage state has been detected, appropriate action may then be taken to prevent potentially corrupt data output by the ADC 110 from being used within calculations. Furthermore, the fact that an excessive voltage state has been detected could then be signalled through, say, an interrupt event that would signal to an application requiring the data output by the ADC 110. In this manner, the application would no longer rely on the integrity of the current or previously stored ADC data on the affected and also adjacent/nearby pads. Additionally, a timestamp of the injection current event may be checked against a timestamp of ADC measurements to determine which ADC results to disregard.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the detection circuitry 120 has been illustrated and described above as a separate, independent logical entity. However, it will be appreciated that detection circuitry adapted in accordance with some alternative embodiments of the present invention may equally form an integral part of one or more other logic entities within the integrated circuit device. For example, it is contemplated that the detection circuitry 120 may, at least partly, form an integral part of the ADC 110. Additionally/alternatively, at least a part of the detection circuitry 120 may form an integral part of a pad structure for the appropriate external contact 105. It is still further contemplated that at least a part of the detection circuitry may additionally/alternatively form an integral part of the SoC 180 or other signal processing functionality that receives the output 135 of the ADC 110.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediary components. Likewise, any two components so associated can also be viewed as being "operably connected", or "operably coupled", to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as "computer systems".

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit device comprising at least one analogue to digital converter, the at least one ADC comprising at least one input operably coupled to at least one external contact of the integrated circuit device; wherein the integrated circuit device further comprises detection circuitry comprising at least one detection module arranged to:
   receive at a first input thereof an indication of a voltage level at the at least one input of the at least one ADC;
   compare the received indication to a threshold value; and
   if the received indication exceeds the threshold value, output an indication that an excessive voltage state at the at least one input of the at least one ADC has been detected, wherein the indication that the excessive voltage state has been detected is utilized to prevent propagation of output values from the at least one ADC caused by the excessive voltage state.

2. The integrated circuit device of claim 1 wherein the detection circuitry is further arranged to:
   receive at a second input thereof a supply voltage for the integrated circuit device,
   compare the received indication of a voltage level at the at least one input of the at least one ADC to the supply voltage; and
   if the received indication exceeds the supply voltage, to output an indication that an excessive voltage state at the at least one input of the at least one ADC has been detected.

3. The integrated circuit device of claim 2 wherein the detection circuitry further comprises a voltage offset component operably coupled between the at least one input of the at least one ADC and the first input of the at least one detection module.

4. The integrated circuit device of claim 3 wherein the integrated circuit device further comprises electrostatic discharge protection circuitry operably coupled between the at least one input of the at least one ADC and the supply voltage.

5. The integrated circuit device of claim 4 wherein the voltage offset component is arranged to provide a voltage offset between the at least one input of the at least one ADC and the first input of the at least one detection module representative of a voltage drop across the ESD protection circuitry during an excessive voltage state at the at least one input of the at least one ADC.

6. The integrated circuit device of claim 4 wherein the ESD protection circuitry comprises a diode operably coupled between the at least one input of the at least one ADC and the supply voltage and forward biased towards the supply voltage.

7. The integrated circuit device claim 3 wherein the voltage offset component comprises a diode operably coupled between the at least one input of the at least one ADC and the first input of the at least on detection module and forward biased towards the first input of the at least one detection module.

8. The integrated circuit device of claim 1 wherein the at least one detection module comprises a comparator having a first input and a second input and arranged to:
   receive at the first input the indication of the voltage level at the at least one input of the at least one ADC;
   receive at the second input the threshold value;
   compare the received indication of the voltage level at the at least one input of the at least one ADC to the threshold value; and
   output a result of the comparison.

9. The integrated circuit device of claim 8 wherein the at least one detection module further comprises a latch component, arranged to:
   receive at a first input the result of the comparison output by the comparator; and
   upon the result of the comparison indicating that the voltage level at the at least one input of the at least one ADC exceeds the threshold value, set an output thereof to indicate that an excessive voltage state at the at least one input of the at least one ADC has been detected.

10. The integrated circuit device of claim 1 wherein the output of the detection circuitry is operably coupled to at least one signal processor of the integrated circuit device.

11. The integrated circuit device of claim 10 wherein, upon detection of an excessive voltage state at the at least on input of the at least one ADC by the detection module, the at least one signal processor is arranged to provide a external notification that an excessive voltage state has been detected via one or more external pins of the integrated circuit device.

12. The integrated circuit device of claim 1 wherein the output of the detection circuitry is operably coupled to at least one timebase latch of the ADC.

13. The integrated circuit device of claim 1 wherein the output of the detection circuitry is operably coupled to at least one interrupt module arranged to interrupt at least one from a group consisting of: triggering and status bit modification.

14. A method for detecting an excessive voltage state for at least one input of at least one analogue to digital converter, the method comprising:
   receiving an indication of a voltage level at the at least one input of the at least one ADC;
   comparing the received indication to a threshold value; and
   if the received indication exceeds the threshold value, outputting an indication that an excessive voltage state at the at least one input of the at least one ADC has been detected, wherein the indication that the excessive voltage state has been detected is utilized to prevent propagation of output values from the at least one ADC caused by the excessive voltage state.

15. The method of claim 14 further comprising:
   receiving, at a first input of a comparator, the indication of the voltage level at the at least one input of the at least one ADC;
   receiving, at a second input of the comparator, the threshold value;
   comparing the received indication of the voltage level at the at least one input of the at least one ADC to the threshold value; and
   outputting a result of the comparison.

16. The method of claim 15 further comprising:
   receiving, at a first input of a latch, the result of the comparison output by the comparator; and
   if the voltage level at the at least one input of the at least one ADC exceeds the threshold value, setting an output of the latch to indicate that an excessive voltage state at the at least one input of the at least one ADC has been detected.

17. The method of claim 14 further comprising:
   providing a voltage offset between the at least one input of the at least one ADC and a first input of a detection module representative of a voltage drop across an ESD protection circuitry during an excessive voltage state at the at least one input of the at least one ADC.

18. An integrated circuit device comprising:
   an analogue to digital converter (ADC), the ADC including:

an input operably coupled to an external contact of the integrated circuit device; and detection circuitry including:

a detection module to receive at a first input thereof an indication of a voltage level at the input of the ADC, to compare the received indication to a threshold value, and if the received indication exceeds the threshold value then output an indication that an excessive voltage state at the at least one input of the at least one ADC has been detected, wherein an output of the detection circuitry is operably coupled to a timebase latch of the ADC.

19. The integrated circuit device of claim 18 wherein the at least one detection module includes a comparator having a first input and a second input, the comparator to receive at the first input the indication of the voltage level at the input of the ADC, to receive at the second input the threshold value, to compare the received indication of the voltage level at the input of the ADC to the threshold value, and output a result of the comparison.

20. The integrated circuit device of claim 19 wherein the at least one detection module further includes a latch component to receive, at a first input, the result of the comparison output by the comparator, and if the voltage level at the input of the ADC exceeds the threshold value, set an output thereof to indicate that an excessive voltage state at the input of the ADC has been detected.

\* \* \* \* \*